United States Patent [19]

Moates

[11] 4,374,384

[45] Feb. 15, 1983

[54] MATRIX ENCODER FOR RESISTIVE SENSOR ARRAYS

[75] Inventor: Roger D. Moates, Raleigh, N.C.

[73] Assignee: Westinghouse Electric Corp., Pittsburgh, Pa.

[21] Appl. No.: 182,295

[22] Filed: Aug. 28, 1980

[51] Int. Cl.³ .................. G08C 19/04; G08C 19/36
[52] U.S. Cl. .................. 340/870.38; 340/365 S; 340/347 AD; 340/870.29
[58] Field of Search .......... 340/347 M, 365 R, 365 P, 340/870.38, 870.29, 870.28, 870.13, 870.02, 870.03, 825.79; 250/231 SE

[56] References Cited

U.S. PATENT DOCUMENTS

| | | | |
|---|---|---|---|
| 3,484,780 | 12/1969 | Kamoi et al. | 340/347 P |
| 3,573,773 | 4/1971 | O'Hanlon | 340/870.29 |
| 3,662,368 | 5/1972 | Farnsworth et al. | 340/151 |
| 3,806,875 | 4/1974 | Georget | 340/151 |
| 3,815,126 | 6/1974 | Batz | 340/347 P |
| 4,037,219 | 7/1977 | Lewis | 250/231 SE |
| 4,099,163 | 7/1978 | Worley et al. | 340/365 S |
| 4,137,451 | 1/1979 | Einolf | 250/231 SE |
| 4,145,687 | 3/1979 | Masuda | 340/365 S |
| 4,207,616 | 6/1980 | Heeren | 307/205 |
| 4,269,102 | 5/1981 | Kondo et al. | 340/365 S |

*Primary Examiner*—James J. Groody
*Attorney, Agent, or Firm*—Robert E. Converse, Jr.

[57] ABSTRACT

An encoder includes an array of variable resistance photosensors responsive to variations of incident illumination. The array is interconnected in a row and column matrix having row inputs connected to a sampling control device for sequential application of a predetermined voltage to the inputs. The matrix column outputs are connected to a detecting circuit having a current-measuring detector for receiving sensing currents from the outputs and for producing current responsive detection signals in response to the application of the predetermined voltage at the inputs. The outputs are held at a constant voltage, thereby providing effective isolation between the column outputs and eliminating interaction between elements connected to adjacent columns without the need of additional isolation means, such as isolation diodes, at each matrix intersection.

31 Claims, 7 Drawing Figures

MATRIX ENCODER FOR RESISTIVE SENSOR ARRAYS

BACKGROUND OF THE INVENTION

1. Field of the Invention

This invention relates to encoders and more particularly to improved matrix and detecting circuit arrangements for encoders including arrays of resistive sensors.

2. Description of Prior Art

Electrical control and measuring apparatus usually are required to monitor a physical condition in order to perform an intended operating function. Typically, predetermined command functions, status reporting functions or measurement functions are produced in response to the monitored conditions. Electronic encoders are included in the electrical apparatus to generate analog or binary coded output signals responsive to the changes in the status of the monitored condition. The encoder output signals are either used at the apparatus or transmitted via a telemetry communication system to remote equipment. Generally, the encoders include a transducer or sensor unit, a detecting unit and a readout unit. The transducer unit typically includes a network of several electrical sensors having variable voltage, current, impedance, frequency or phase angle sensing states responsive to the monitored condition. The detecting unit includes both sampling control and detecting circuits to sample the sensing states of the sensors and produce corresponding detection signals. In turn, the readout unit converts the detection signals into coded output signals representing the status information in a desired form and format.

Various types and forms of encoders are known for producing coded data outputs in response to one or more inputs. The different encoder types are chiefly determined by the different types of input and output arrangements thereof and the various modes of input and output operation. When the encoders include large arrays of sensor or encoding elements, the encoder arrangements and operations often become somewhat complex and complicated.

One general mode of operation in encoders includes determining, on a one at a time basis, the status at each individual sensor element of a large array. Examples of this one general mode of operation are disclosed in U.S. Pat. Nos. 4,037,219, issued July 10, 1979, and 4,137,451, issued Jan. 30, 1979, both assigned to the assignee of this invention. Several arrangements are known for scanning or sampling array sensor elements and detecting the status thereat. For example, a single encoder input can be arranged to sequentially examine many sensor elements by being physically displaceable relative to the elements or by having a means for coupling each of the elements to the single input. Complexities of mechanical design or the space required for such single input arrangements may, however, prevent their use. In another arrangement, separate inputs to each of the array sensor elements permit individual monitoring of each element or group of elements in a parallel fashion. Simultaneous parallel encoding of many sensing elements does reduce the time otherwise required for sequentially sampling and encoding the same number of elements. Often it is undesirable to have a large number of encoder inputs, as would be required for a large array of sensors, and especially undesirable to have large numbers of both inputs and outputs when separate outputs are also provided for each element.

Further encoder arrangements are known to reduce the number of encoder inputs and outputs and to simplify the input and output scanning and detecting operations. In particular, sensor elements of large circuit networks can be interconnected to reduce the number of inputs and outputs. When the sensor elements are connected in a network having the row and column organization of a rectangular matrix network, the number of element interconnections can be reduced as well as having the number of associated inputs and outputs reduced. It has been found, however, that selecting a specific matrix configuration for an encoder array involves several and often conflicting considerations. Some critical considerations especially occur when the elements of a large array are of a variable impedance type and are interconnected by common row and column conductors in a matrix circuit arrangement. For example, resistive sensors form one type of variable impedance element that can be interconnected in such a matrix circuit arrangement, but their resistance values can produce multiple diverging branch paths and interfering series paths within the matrix. Thus, scanning of a row input and a column output associated with a preselected resistive sensor may not provide a unique sensing state at the output. Still further, the output sensing state is particularly affected when the other resistive sensors of the array can have different and varying resistances at any instant.

Examples of arrays having a resistive sensor type of encoding element are described in the aforementioned U.S. Pat. Nos. 4,037,219 and 4,137,451 wherein the arrays specifically include photoconductive type resistive sensors. The photoconductive sensors have resistance values which vary in response to dial shaft encoding patterns of illumination. The photoconductive sensor arrays in the two aforementioned patents are connected in a circuit network having separate input terminals which are sequentially scanned. Voltage sensing signals are developed at a single output for detection of the sensor resistance values by an analog voltage comparator detecting circuit. The separate scanning inputs of the aforementioned encoder arrangements substantially aid in isolating the sensor resistance values to be detected in an array, however, for arrays having large numbers of sensors, it is sometimes unduly complex to provide a correspondingly large numbers of inputs to scan each sensor.

U.S. Pat. Nos. 3,806,875 and 3,662,368 disclose further examples of encoders including photocell arrays arranged to be responsive to the encoding of meter dial readings. The conductive and nonconductive states of the photocells are sampled through separate input leads to generate coded readout signals for remote meter readings. The last two named patents have arrangements of separate scan inputs and separate sensing outputs for each different sensor and such arrangements have substantially increased complexity when used with large arrays.

In U.S. Pat. No. 3,573,773, a meter dial encoder readout device is disclosed having an array of photoconductive-type photocell sensors connected in a network with additional diodes and resistors to incrementally vary the total resistance of the network. Although the encoder arrangement avoids sampling at multiple scan inputs, the encoder operation is limited by activating only two sensors at any one instant while requiring diodes to provide current isolation between the sensors.

When providing separate scanning inputs to array networks such as included in the encoders described above and having a large number of sensor elments, one specific difficulty is in providing a circuit, referred to herein as a sampling control, to produce the sequential scanning signals. Circuit devices for sampling control circuits may have a fixed and limited number of input-/output terminals, such as provided in some small microprocessor devices, often requiring additional and complex counter, shift register or multiplexing circuits at either or both of the network inputs and outputs. Thus, connecting an array in a matrix circuit arrangement can simplify the sampling control circuits by providing fewer scanning input terminals and sensing output terminals. As is known, the sum of the inputs and outputs of a rectangular matrix arrangement can be substantially less than the number of sensor connected intersections which equals the product of the inputs multiplied by the outputs.

To connect an array in a matrix circuit arrangement to avoid the large encoder input and output arrangements, some of the aforementioned difficulties are found to exist. For example, when the photoconductive sensor array described in the aforementioned U.S. Pat. No. 4,137,451 is connected in a rectangular matrix, rather than in the network disclosed therein, the voltage comparator detecting circuit was sometimes found ineffective to unambiguously distinguish the variable resistance states of each of the photoconductive sensors of the array. One observed difficulty in sampling the individual sensor states is the many parallel and branch current paths that are formed through the resistive sensors being interconnected by the row and column conductors of the matrix. When one matrix configuration is selected having more outputs and fewer inputs than another configuration, the number of possible diverging intercolumn branch circuits increases. The diverging branch current values also vary as different groups of sensors are illuminated and darkened so as to have different encoding resistance states at any given sampling time. Further error producing factors are attributed to variations in the photoconductive sensor characteristics and variations in the encoding levels of illumination and darkness at different sensors. Isolating diodes can be connected to each sensor of a rectangular matrix but this substantially increases the complexity and cost of the matrix. Further difficulty is found in connecting the separate diodes when all of the photoconductive sensors are formed on a common circuit substrate with additional terminals and connections being difficult to form and provide thereon. Also, it is found that in providing separate detecting circuits at each matrix column output, the detecting circuits may also form parts of the branch current paths and further, they must have closely matched characteristics and threshold sensing levels to further avoid ambiguous detection signal outputs.

With the above considerations found in the prior art in mind, the present invention provides an encoder including an improved matrix circuit arrangement for interconnecting a variable resistance sensor array with an improved current responsive detecting circuit being provided for sensing the state of each sensor and producing detection signals having improved accuracies as summarized hereinafter.

SUMMARY OF THE INVENTION

In accordance with the present invention an encoder is provided for a resistive sensor array including sensor elements having variable resistance values in response to variations of a monitored condition. The sensors are connected at the intersections of a rectangular matrix circuit arrangement defined by parallel rows of conductors terminated at inputs to the matrix and parallel columns of conductors terminating at sensing outputs of the matrix. The matrix inputs are sequentially connected to a predetermined voltage. The energization of a row conductor produces current flow through the row of resistive sensors connected thereto. The individual sensor currents then flow into the separate column conductors also connected to the energized sensors. The matrix outputs terminating the column conductors are connected to a detecting circuit having individual current measuring detectors for separately receiving the sensing currents produced in parallel fashion by each row of energized sensors. The column conductor outputs are maintained at substantially constant and equal voltages, preferably at substantially zero or a ground reference potential, even though different sensing current magnitudes are conducted therein and into the sensing inputs of the detectors. The outputs of the current measuring detectors produce detection signals responsive to the sensing currents which, in turn, correspond to the sensor resistances.

Accordingly, the scanning energization of each matrix input effects independent and parallel sampling of the sensors connected to the associated row conductor. The sensing current through each energized sensor is isolated and independent of the other sensors physically connected to the same column conductor because the other matrix inputs from the energizing voltage are disconnected and maintained in an open circuit condition or very high impedance condition preventing any current flow between the row conductors. The sensing current of the column conductor associated with an energized sensor is further isolated by not being diverted into branch paths through still other sensors physically connected to the other column conductors because negligible voltage differences exist between all of the column conductors. In one mode of operation of the present invention, the outputs of the current measuring detectors in the detecting circuit produce plural detection signals in parallel in response to the scanning inputs to each row conductor of the matrix.

In one preferred form of the present invention, the current measuring detectors of the detecting circuit are provided by integrated circuit current-differencing amplifiers. Voltage drops across the inputs of the current-differencing amplifiers are maintained by internal biasing at substantially constant and negligible values compared to the predetermined voltage applied to the matrix inputs. Each of the measuring detector current-differencing amplifiers have closely matched characteristics when provided in a common large scale integrated circuit package requiring only a single power supply voltage which is preferably made equal to the predetermined voltage applied to the matrix inputs.

Still further in accordance with the present invention, a compensating reference circuit is provided in the detecting circuit including a further current-differencing amplifier which is matched to the current-differencing amplifiers forming the current measuring detectors by being included in the same integrated circuit package. The reference circuit current-differencing amplifier is connected to operate in an active voltage divider mode to provide a predetermined reference voltage output. Reference resistors are connected between the reference voltage and the reference inputs at each of the current measuring detectors. Reference currents are established by the reference circuit voltage output and the reference resistors to provide predetermined current thresholds at the current-differencing amplifiers forming the measuring detectors for the switching or high gain current comparator mode of operation thereof. The switching threshold is made with respect to a predetermined change in the resistance of the resistive sensors that is to be detected and represented by a change in the state of binary type detection signals.

A preferred form of the invention also includes a matrix circuit for interconnecting a photoconductive resistive array wherein predetermined changes between the low and high resistances of encoding sensors are produced in response to encoded illuminating and dark conditions, respectively. The reference currents applied to the reference inputs to the current-differencing amplifiers in the current measuring detectors are produced by reference resistors formed by photoconductive reference sensors having the same characteristics as the encoding photoconductive sensors but subjected to continuous illumination. The photoconductive reference sensors establish reference current threshold values accommodating both individual variations in the sensor resistance characteristics and the encoding illuminations, and collective variations in the sensor characteristics due to aging and changes in the ambient conditions.

In another form of the invention, the resistive sensor array is connected in the rectangular matrix having the predetermined voltage sequentially applied to the matrix row conductor inputs and further having a plurality of an alternative current measuring detector included in the detecting circuit. The alternative current measuring detectors include current-differencing amplifiers which are operated in an analog sensing mode. The measuring detector outputs produce an analog type of detection signal being proportional to the matrix output sensing currents corresponding to the sensor resistances. The variable sensing current values at the matrix outputs are sensed at sensing inputs to the current-differencing amplifiers forming the analog current measuring detectors in a manner that also maintains the matrix column conductors at a constant and small voltage drop above or substantially at a virtual ground reference potential. Thus, an analog detection signal representation can be generated to indicate the resistance states of sensors in the resistive array.

In still another form of the invention, the resistive sensor array is connected in the rectangular matrix having the predetermined voltage sequentially applied to the matrix row conductor inputs and further having an alternative detecting circuit including measuring detectors formed by operational amplifiers having sensing inputs thereof connected to the matrix column conductor outputs. The measuring detectors are operative in either a combined analog and comparator mode in one form to produce binary detection signals or only in an analog mode in another form to produce analog detection signals representing the resistance variations of the resistive sensors. The sensing inputs to the operational amplifiers are also coupled to the amplifier outputs via output feedback resistors so as to provide balanced current conditions at the sensing inputs. The currents produced through the amplifier feedback resistance vary as the sensing currents vary. Thus, a predetermined output voltage is then representative of sensor resistance variations to be detected. The operational amplifier output voltages directly provide analog detection signals or are applied to additional comparator circuits to produce the binary detection signals. The balanced conditions provided at the matrix outputs by the operational amplifier feedback voltages maintain a virtual ground reference potential at each column conductor and the negligible intercolumn voltage difference conditions in accordance with this invention.

Accordingly, it is a general feature of this invention to provide an improved circuit arrangement and method of sampling and detecting the variable resistance of resistive sensors included in an encoding array to sense variations in a monitored condition. A rectangular matrix circuit is provided for directly connecting the sensors between a minimum of matrix inputs and outputs without requiring additional matrix modifying or isolating circuit elements. Matrix input isolation and scanning is provided when sequentially sampling the individual variable resistances of each resistive sensor. In a uniquely cooperative manner, variable sensing currents are produced from the matrix outputs while concurrently maintaining the matrix outputs at constant and a virtually ground reference potential. The efficiently arranged encoder has simplified modes of operation to produce unambiguously encoded output signals representing the sensor resistance state to be detected. Other features and advantages of the present invention will be apparent to those skilled in the art by reference to the description of the preferred embodiments shown in the drawings briefly described hereinafter.

DETAILED DESCRIPTION OF THE PREFERRED EMBODIMENTS

Figure 1:
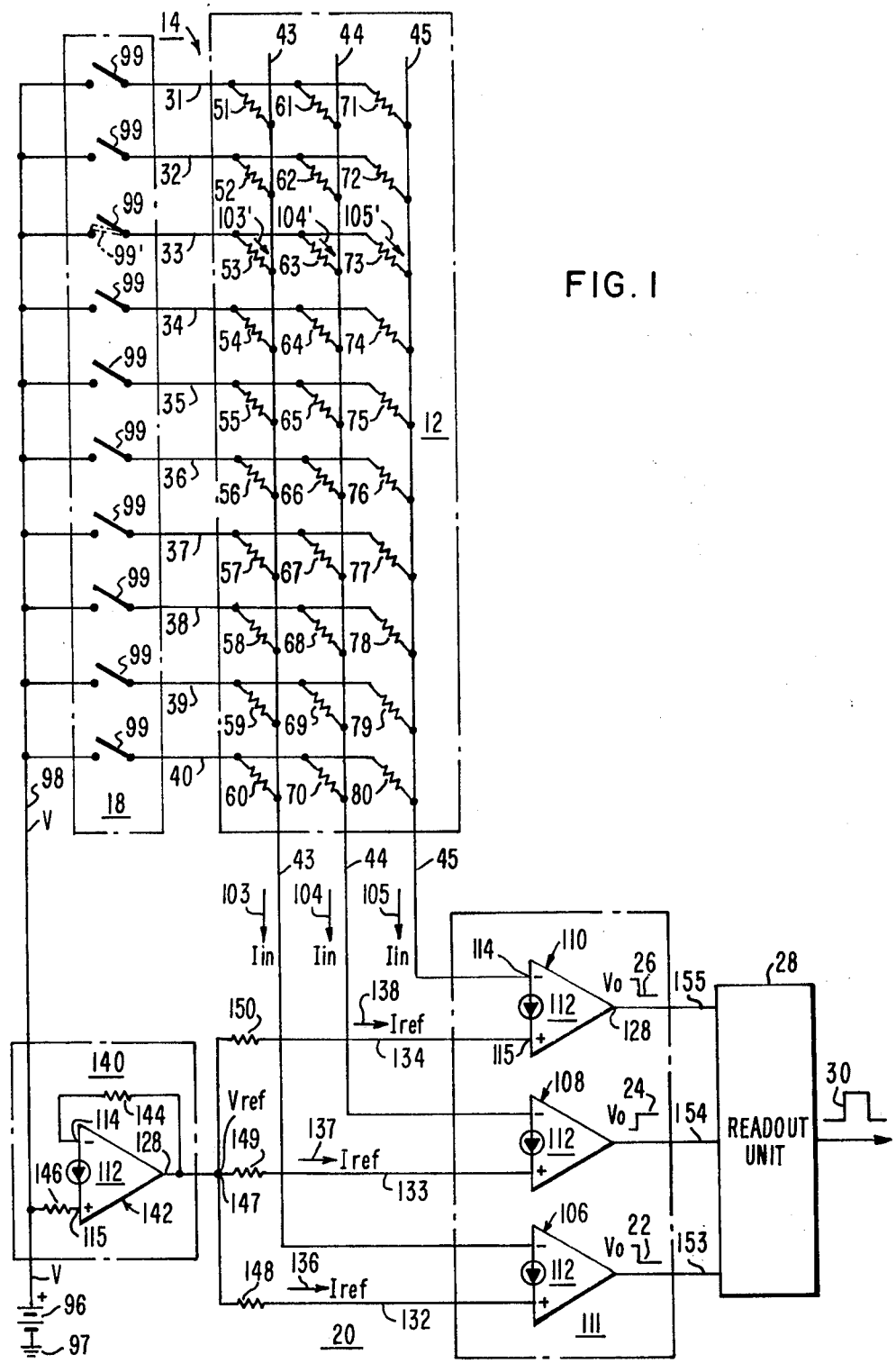
FIG. 1 is a circuit diagram of an encoder including a resistive sensor array connected for operation in accordance with the present invention.

Referring now to the drawings wherein the same or like parts thereof are designated by the same reference numeral and more particularly to FIG. 1, a circuit diagram of an encoder 10 is shown which is suitable for use in electrical control and/or measuring apparatus including a resistive sensor array 12 responsive to a physical condition to be monitored. The array 12 has individual resistive sensors connected in a rectangular matrix 14 as described in detail hereinbelow. The encoder 10 further generally includes both a sampling control 18 connected to the inputs of the matrix 14 and a detecting circuit 20 connected with the outputs of the matrix 14. The detecting circuit 20 produces detection signals 22, 24 and 26 in response to changes in the resistances of the sensors in the array 12. A readout unit 28 receives the detection signals from the detecting circuit 20 to produce coded output signals 30 having binary coded information representing the status of the monitored condition.

The matrix 14 has the rectangular configuration shown in FIG. 1 including, by way of example and not limitation, ten electrically parallel row conductors 31, 32, 33, 34, 35, 36, 37, 38, 39 and 40 and three electrically parallel column conductors 43, 44 and 45. Each of the ten row conductors are to be understood as intersecting the three column conductors in a mutually insulated relationship. The rectangular configuration of the matrix 14 may be formed by an electrically equivalent network wherein the row conductors 31 through 40 and the output conductors 43, 44 and 45 are connected to opposite terminals, respectively, of resistive sensors of the array 12, as described hereinbelow, without physically having the straight parallel and mutually perpendicular intersecting configuration of the lines shown in FIG. 1 as is understood by those skilled in the art.

The array 12 includes thirty resistive sensors connected in the matrix 14 with a first group of sensors 51, 52, 53, 54, 55, 56, 57, 58, 59 and 60 each having one terminal connected to the column conductor 43; a second group of sensors 61, 62, 63, 64, 65, 66, 67, 68, 69 and 70 each having one terminal connected to the column conductor 44; and a third group of sensors 71, 72, 73, 74, 75, 76, 77, 78, 79 and 80 each having one terminal connected to the column conductor 45. Rows of three sensors, each being in separate ones of the above three sensor groups, have the remaining terminals thereof connected to different ones of the ten row conductors 31 through 40 as shown in FIG. 1. Thus, array 12 includes the thirty independent two-terminal sensors such that for any unique sensor, one terminal is exclusively connected to only one row of the matrix 14 while the second terminal is exclusively connected to only one column of the matrix 14.

Figure 3:
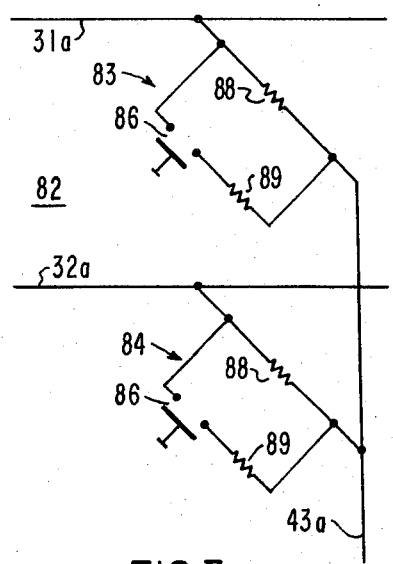
FIG. 3 is a fragmentary circuit of an alternative sensor array including manually operated resistive sensor for providing either of two resistance values.

The resistive sensors of the array 12 are to be understood to include devices which are responsive to a physical condition so as to have a variable resistance in response to the changing status of the monitored condition. Resistive sensors are well known and may include various forms thereof. For example, a keyboard type unit may include an array as partially shown in FIG. 3 which shows a fragmentary view of a matrix 82 corresponding to the matrix 14. The array includes manually variable resistive sensors 83 and 84 connected across a column conductor 43a and row conductors 31a and 32a, respectively. The exemplary sensors 83 and 84 are each shown including a switch 86, and resistors 88 and 89. When the switch 86 is opened and closed, the sensors 83 and 84 have an inactive and higher resistance state, provided by the value of the resistor 88, and an activated and lower resistance state provided by the parallel combination value of the resistors 88 and 89. It should be understood that in practice resistors 88 and 89 could be the open and closed switching impedances respectively of the switch 86.

Figure 4:
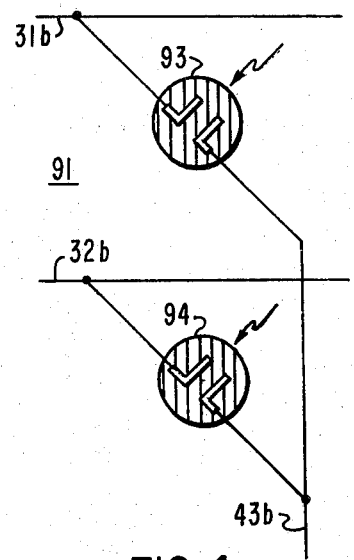
FIG. 4 is a fragmentary circuit of another alternative sensor array including photoconductive type resistive sensors.

Another exemplary resistive sensor type may be included in an array as shown in the fragmentary view of a matrix 91 illustrated in FIG. 4. Photosensitive and more particularly the photoconductive type of resistive sensors 93 and 94 are shown connected across a column conductor 43b and row conductors 31b and 32b, respectively. Photoconductive sensors are known to be constructed of cadmium sulfide and cadmium selenide photoresistive materials which have high resistance when dark, and lower resistances when activated by illuminations of increasing radiation intensity. One preferred form of the present invention includes an array of photoconductive type resistive sensors similar to the array disclosed in the aforementioned U.S. Pat. Nos. 4,037,219 and 4,137,451 for dial shaft encoding operation in an optoelectronic meter dial register encoder as noted further hereinbelow in connection with the description of FIG. 5. Thus, the general sensing response characteristics of interest in the resistive sensors referred to herein are the changes in resistances or impedance values thereof when activated and responding to the status or changes in the status of a physical condition to be monitored by the encoder 10.

For purposes of this description, the encoder 10 shown in FIG. 1 is taken as having the sensor array 12 provided with the previously designated thirty resistive sensors 51 through 80 thereof operative between inactive and substantially identical high resistance states and activated and substantially identical low resistance states to be detected. To effect sampling or measuring of the individual sensor resistances, the matrix 14 has the inputs of the ten row conductors 31 through 40 connected to the sampling control 18. The inputs are switched by the control 18 between a disconnected and open circuit condition and a sequentially connected and closed input condition for coupling to a predetermined voltage V provided at a voltage source 96. The voltage source 96 is, for example, shown connected with its negative terminal connected to the circuit ground reference 97 to provide a positive voltage V on a power supply conductor 98 supplying the control 18. The sampling control 18 is represented with a group of parallel switches 99 each connected in series relationship between the voltage source 96 and a separate one of the inputs to the matrix row conductors 31 through 40. The sampling control 18 can include a counter circuit or an analog multiplexer circuit described in the aforementioned U.S. Pat. Nos. 4,037,219 and 4,137,451 or a computer controlled circuit shown in FIG. 5 and described more fully hereinbelow.

An important operating feature of the sampling control 18 is the scanning of the resistive sensors by separately energizing the matrix inputs to the row conductors 32 through 40 in a predetermined sequential order. When the row conductors 31 through 40 are not being scanned or energized, the switches 99 of the sampling control 18 normally maintain the external inputs to the row conductors 31 through 40 in the open (high impedance) and isolated circuit condition rather than at a common grounded reference potential or at an equal and opposite voltage relative to the positive voltage V as provided in some sampling control arrangements. Thus, to scan and sample the resistance states of the resistive sensors of the array 12, each of the switches 99 is sequentially closed, to provide a very low impedance, so that the voltage V is exclusively applied to one row conductor at a time and the associated row connected resistive sensors are commonly energized. Sensing currents will then flow through each of the three energized sensors to produce three sensing currents having values corresponding to the value of resistance of the scanned sensors.

Referring now to the detecting circuit 20, the three outputs of the matrix column conductors 43, 44 and 45 are connected to the detecting circuit 20 to receive sensing current signals Iin represented by arrows 103, 104 and 105 flowing in the column conductors 43, 44 and 45, respectively, in response to the currents flowing through each row of scanned sensors. The three column conductors 43, 44 and 45 are connected to separate ones of the first, second and third groups of resistive sensors, as shown in FIG. 1 and described hereinabove. Three current measuring detectors 106, 108 and 110 are included in a common amplifier circuit network 111 in the detecting circuit 20 to receive the sensing currents 103, 104 and 105, respectively, each having varying values Iin. In one preferred embodiment of this invention, the current measuring detectors include individual current-differencing amplifiers 112 chiefly characterized as operating in a current mode and producing an output voltage Vo dependent upon the difference between input currents supplied to inverting (−) and non-inverting (+) inputs 114 and 115, respectively.

Figure 2:
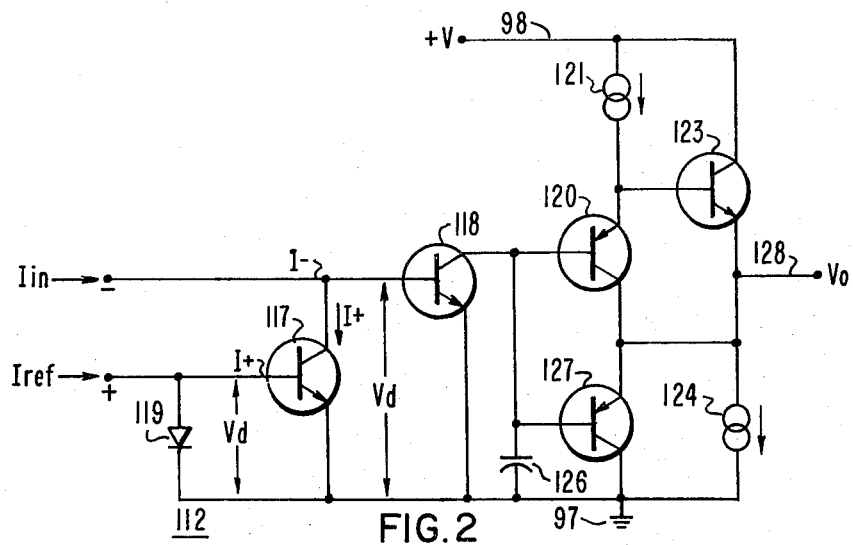
FIG. 2 is a basic simplified circuit diagram of one of plural current-differencing amplifiers included in the encoder shown in FIG. 1.

Before further describing the detecting circuit 20 a brief summary of the further characteristics of one of the identical current-differencing amplifiers 112 is made as each is provided in the amplifier circuit network 111 by reference to the FIG. 2 wherein a basic simplified circuit of the current-differencing amplifier 112 is shown. One form of each of the current-differencing amplifiers 112 in the network 111 is provided by a type LM 3900 available from the National Semiconductor Corporation and including a single dual-in-line package having four of the current-differencing amplifiers 112 fabricated on a single integrated circuit chip. The current-differencing amplifiers require only a single power supply voltage, rather than a split plus-minus power supply as required by conventional operational amplifiers. The first and inverting (−) and second and noninverting (+) inputs 114 and 115 are shown in FIG. 1 providing the sensing and reference inputs, respectively, of each of the current measuring detectors 106, 108 and 110. The input circuit of the amplifier 112, as shown in FIG. 2, includes NPN transistors 117 and 118 and a diode 119. The diode 119 and transistor 117 form a "current mirror" connected across the inverting input 114. In the current mode of operation, the current I+ at the input 115 is "mirrored" or reflected above ground and then extracted from the inverting input 114. Both inputs 114 and 115 are always biased at the voltage drop Vd across the base-to-emitter junctions of the transistors 117 and 118 which equals one diode voltage drop. Therefore, the inputs 114 and 115 are biased at the one diode voltage drop Vd, in the order of 0.6 volt, above the ground reference 97. The substantially constant and low voltage drops across the inputs 114 and 115 are maintained regardless of the changes in level of the input currents I− and I+.

In the basic and simplified circuit schematic shown for the amplifier 112 in FIG. 2, a lateral PNP transistor 120 having a current source 121 connected in the emitter thereof couples the transistor 118 to an emitter follower NPN output transistor 123 having a current source 124 connected in the emitter thereof as shown. A closed loop stabilizing capacitor 126 and a PNP transistor 127, for providing Class B operation, are connected to the transistor 120 as shown. The output 128 of the circuit 112 is provided at the emitter of the transistor 123 to produce the output voltage Vo. The output voltage Vo has a large dynamic range from essentially the ground reference potential to approximately one base-to-emitter voltage drop, of the transistor 123, less than the power supply voltage V. Thus, the current mode of operation of the current-differencing amplifier 112 produces an output voltage Vo at the output 128 responsive to the current differences between Iin and Iref applied to the inputs 114 and 115.

While the internal biasing of the inputs 114 and 115 of the amplifier 112 shown in FIG. 2 provides the constant and minimized voltage, due to the input diode voltage drops, at the matrix outputs; it is contemplated that alternative constant voltage arrangements may be used at the outputs of the column conductors. For example, different constant and minimizing voltage circuit arrangements are provided at the matrix outputs in the alternative measuring detector arrangements shown in FIGS. 6 and 7 and described hereinbelow and even the nominal single diode voltage drops at the current-differencing amplifier inputs can be compensated for as described further in connection with the description of the encoder 10.

The power supply connections of the current measuring detectors 106, 108 and 110 to the circuit network 111 of FIG. 1 are not shown therein but can be connected as shown in FIG. 2 to the same encoder power supply conductor 98 and ground reference 97 that are shown in FIG. 1. In one preferred form, the voltage source 96 provides plus five volts DC on the power supply conductor 98. Thus, to simplify the encoder 10, the voltage source 96 provides not only the predetermined input scanning voltages to the inputs of the matrix 14 but also the same single power supply source for the current-differencing amplifiers included in the current measuring detectors 106, 108 and 110.

The current measuring detectors 106, 108 and 110 of the detecting circuit 20 are shown in FIg. 1 connected to operate in a switching and high gain current comparator mode with the first and inverting input 114 of each detector defining a sensing input connected to the conductors 43, 44 and 45 to receive the sensing currents 103, 104 and 105, respectively. The second and noninverting input 115 of each of the measuring detectors 106, 108 and 110 define a reference input and each input 115 is connected to conductors 132, 133 and 134 to receive the reference currents 136, 137 and 138, respectively. The reference currents establish a predetermined threshold level for the switching mode of operation of the detectors. Thus, the sensing currents 103, 104 and 105 will vary above and below the current threshold levels established by the reference current signals 136, 137 and 138, respectively. Each of the outputs 128 of the measuring detectors 106, 108 and 110 correspondingly switch between a low or binary zero state, essentially equal to the ground reference potential, and a high or binary one state slightly below the potential of the predetermined input voltage V. It is noted that the above sensing current and reference current inputs may be reversed at the inputs 114 and 115 of the current differencing amplifiers 112. The reversed inputs will correspondingly reverse the switching states and binary logical outputs from those described above.

A compensating reference circuit 140 is shown in FIG. 1, which produces the reference currents 136, 137 and 138 having reference current values Iref. The compensating reference circuit 140 includes a DC amplifier 142 provided by the fourth current-differencing amplifier 112 of the aforementioned type LM 3900 package module. The amplifier 112 is the same as shown in FIG. 2 and described for the detectors 106, 108 and 110 and is physically included in the same integrated circuit including the network 111. The DC amplifier 142 operates so as to be generally analogous to an active type of voltage divider when a feedback resistor 144 is connected between the output 128 thereof and the first and inverting input 114 thereof. The second and noninverting input 115 is connected through an input resistor 146 to the power supply conductor 98 to further simplify the encoder 10. The output 128 of the amplifier 142 provides a common reference voltage Vref at the junction 147 to one end of each of three reference resistors 148, 149 and 150 connected in series with the reference input conductors 132, 133 and 134, respectively. Thus, the voltage Vref at the junction 147 and the reference resistors 148, 149 and 150 develop the reference current values Iref for the currents 136, 137 and 138 for the detectors 106, 108 and 110.

The operation of the compensating reference circuit 140 provides three generally important functions. The first is to establish predetermined reference currents Iref on conductors 132, 133 and 134 for establishing a predetermined current threshold at the current measuring detectors for the current comparator mode of operation thereof. The second is to compensate or offset the small voltage drop difference at the first inputs 114 of each of the measuring detectors which maintain the matrix output conductors 43, 44 and 45 at approximately the one diode drop above the ground reference as described hereinabove. The third function is to compensate for variations in the supply voltage, ambient temperature and encoding illumination variations, and manufacturing tolerances causing parameter variations inherent in the array itself.

The compensating reference circuit 140 produces the reference currents 136, 137 and 138 to set the switching thresholds of the measuring detectors 106, 108, and 110 to be responsive to the sensing current value produced by a critical sensor resistance having a predetermined ratio relative to the resistance of the reference resistors 148, 149 and 150. The reference currents are produced to further provide the switching thresholds to be substantially independent of the parameter variations in the individual sensors and in the circuits of the detectors 106, 108 and 110 which may occur due to component aging, ambient variations and voltage source variations.

One exemplary operating condition of the detecting circuit 20 is provided by a critical resistance (Rx) of each of the resistive sensors 51 through 80 having a predetermined ratio (n) relative to the reference resistance (Rref) of each of the reference resistors 148, 149 and 150. The ratio n of the critical resistance Rx relative to the reference resistance Rref (n equals Rx/Rref) is also equal to the ratio (V−Vd) divided by (Vref−Vd) or $(V-Vd)/(Vref-Vd)$ where V is the predetermined voltage provided by the source 96, Vref is the voltage produced at the junction 147 and Vd is the base-to-emitter voltage drop across the inputs 114 and 115 and being approximately 0.6 volt which is the same at all of the inputs to the measuring detectors 106, 108 and 110. A further relationship is provided in the reference circuit 140 wherein the ratio (Vref−Vd) divided by R2 equals the ratio (V−Vd)/R1 or $(Vref-Vd)/R2=(V-Vd)/R1$ where R1 is the resistance of resistor 146 and R2 is the resistance of 144. By further equating the above ratio relationships the ratio n equals R1 divided by R2 or $n=R1/R2$. Thus in the encoder 10 of FIG. 1, the above operating condition provides at the outputs 128 of the current-differencing amplifiers 112 one binary state (for example a binary logical 1) when a sampled sensor has a resistance greater than the critical resistance Rx or greater than n times Rref and the opposite binary state (for example a binary logical 0) when a sampled sensor has a resistance less than the critical resistance Rx or less than n times Rref.

It is briefly noted that the detectors 106, 108 and 110 are still effective, but with less accuracy, to measure a sensor critical resistance Rx when the reference voltage Vref at the junction 147 is provided by a separate and independent voltage source. If either or both of the reference voltage Vref and resistance Rref values are variable and both are capable of being known, then the values Vref and Rref, which provide a switching state at the measuring detectors 106, 108 and 110, also provide a close measure of the sensor resistance Rx. The resistance Rx is detected when producing the associated sensing current at the time of switching in accordance with the relationship $Rx=(V\times Rref)/Vref$, since the predetermined voltage V for energizing the sensors is also known. Accordingly, when the scanning input voltage V and reference voltage Vref have known predetermined values, a critical sensor resistance Rx may be detected when defining the predetermined ratio n with respect to a reference resistor value Rref or $n=(Rx/Rref)$. Thus, if an adjustable reference voltage or adjustable reference resistors are provided in the reference circuit 140 to produce adjustable threshold values in the reference current values Iref, different critical resistance values of Rx of the resistive sensors in the array 12 can be detected.

In one preferred mode of operation contemplated for this invention, the resistive sensors of the array 12 are taken as having either a predetermined low and critical resistance value Rx to produce a predetermined high sensing current level or resistance values substantially higher than the critical resistance to produce low sensing current levels substantially below the high sensing current level. Thus, the reference currents are made to establish the switching threshold at the predetermined high sensing current value and so that the threshold is substantially higher than the low sensing current levels. The above threshold detecting arrangement assures that the unsaturated and saturated biased states of the amplifier 112 in the current measuring detectors are produced with certainty to provide unambiguous two state or binary detection signal outputs responsive to the predetermined low and high resistances of the resistive sensors.

A brief review of the operation of the encoder 10 shown in FIG. 1 is made hereinafter assuming the exemplary manner of operation as described hereinabove is by way of example and not limitation. The sensor array 12 is taken as having each of the resistive sensors 51 through 80 thereof either in a predetermined low resistance state or a high resistance state substantially above the low resistance state and the resistance states are to be detected in any combination throughout the array in response to a physical condition being monitored. Thus, each different status of a monitored condition is represented by certain ones of the resistive sensors having the high resistance state and the remaining sensors having the predetermined low resistance state. Initially, each of the matrix inputs will be at an open circuit condition with respect to each other and the predetermined voltage V of the voltage source 96. The sampling control 18 will sequentially close the switches 99 so that the matrix inputs are individually energized to scan, in sets of three, the three resistive sensors connected at their upper terminals to an energized row conductor. For example, the row conductor 33 may be assumed as having the associated one of the switches 99 being closed, as indicated by the broken line 99', by the sampling control 18. The arrows 103' and 105' adjacent the resistive sensors 53 and 73 represent the predetermined high level sensing currents therethrough responsive to a predetermined and critical low resistance at each of the latter two sensors. The line arrow 104' adjacent the resistive sensor 63 represents a low level of sensing current therethrough responsive to the high resistance thereat.

It is important to note that each of the remaining electrically parallel rows of matrix inputs have the open circuit and isolated condition at the remaining open switches 99 substantially providing an infinite impedance at the inputs. It is further important to note that the electrically parallel matrix column conductors 43, 44 and 45 are maintained at the same and substantially zero voltage being at the virtual ground reference potential condition. The common column voltage condition is provided at the matrix outputs by the inputs 114 of the current-differencing circuit 112 in each of the current-measuring detectors 106, 108 and 110 as described above. The constant and substantially zero voltage condition at each of the matrix outputs and column conductors is provided even though variable values of sensing current may flow therethrough, as also noted hereinabove. Effectively, an infinite impedance condition is provided between the matrix column conductors to prevent intercolumn conductor current flow. Thus, the sensing currents 103', 104' and 105' are intended to flow in an ideally isolated manner through the matrix column conductors 43, 44 and 45, respectively, to produce the corresponding unique sensing currents 103, 104 and 105 at the three matrix outputs.

At the two current measuring detectors 106 and 110 the high sensing current Iin levels produced at currents 103' and 105' are at or above the threshold level of the reference currents 136 and 138 to produce a saturated state or on condition at the outputs 128 thereof. Thus, detection signals 22 and 26 are each provided with a low voltage level, (binary logical zero) as shown in FIG. 1, essentially equal to zero or ground reference potential to represent the low resistance states of the sensors 53 and 73. At the remaining measuring detector 108, the low sensing current Iin level produced in the current 104' is below the threshold level of the reference current 137. Thus, an unsaturated or off condition at the output 128 of the detector 108 is produced and correspondingly a high voltage level (binary logical one) is provided in the detection signal 24 of the detector 108. The high positive value of signal 24 is approximately equal to the voltage of the source voltage V. The detection signals 22, 24 and 26 are produced simultaneously when the matrix input conductor 33 is scanned by closing the associated one of the switches 99 connected to its input, as shown in FIG. 1, and the readout unit 28 receives the three detection signals 22, 24 and 26 in parallel from output conductors 153, 154 and 155 of the detectors 106, 108 and 110. The coded output signal 30 of the readout unit 128 is produced serially to have three corresponding low, high, low or binary zero, one and zero states representing the low, high and low resistance states of the sensors 53, 63 and 73, respectively.

In accordance with the description of operation hereinbefore, each of the ten matrix inputs are scanned by being sequentially energized from the voltage supply 96 under control of the sampling control 18 to effect scanning of the resistive sensors three at a time. The sensors of each row conductors are sampled by the three concurrent current-measuring and detecting operations occurring ten times in the detecting circuit 20 to correspondingly produce the binary coded signal 30 representing the encoding condition of the thirty sensors 51 through 80 in the array 12.

Figure 5:
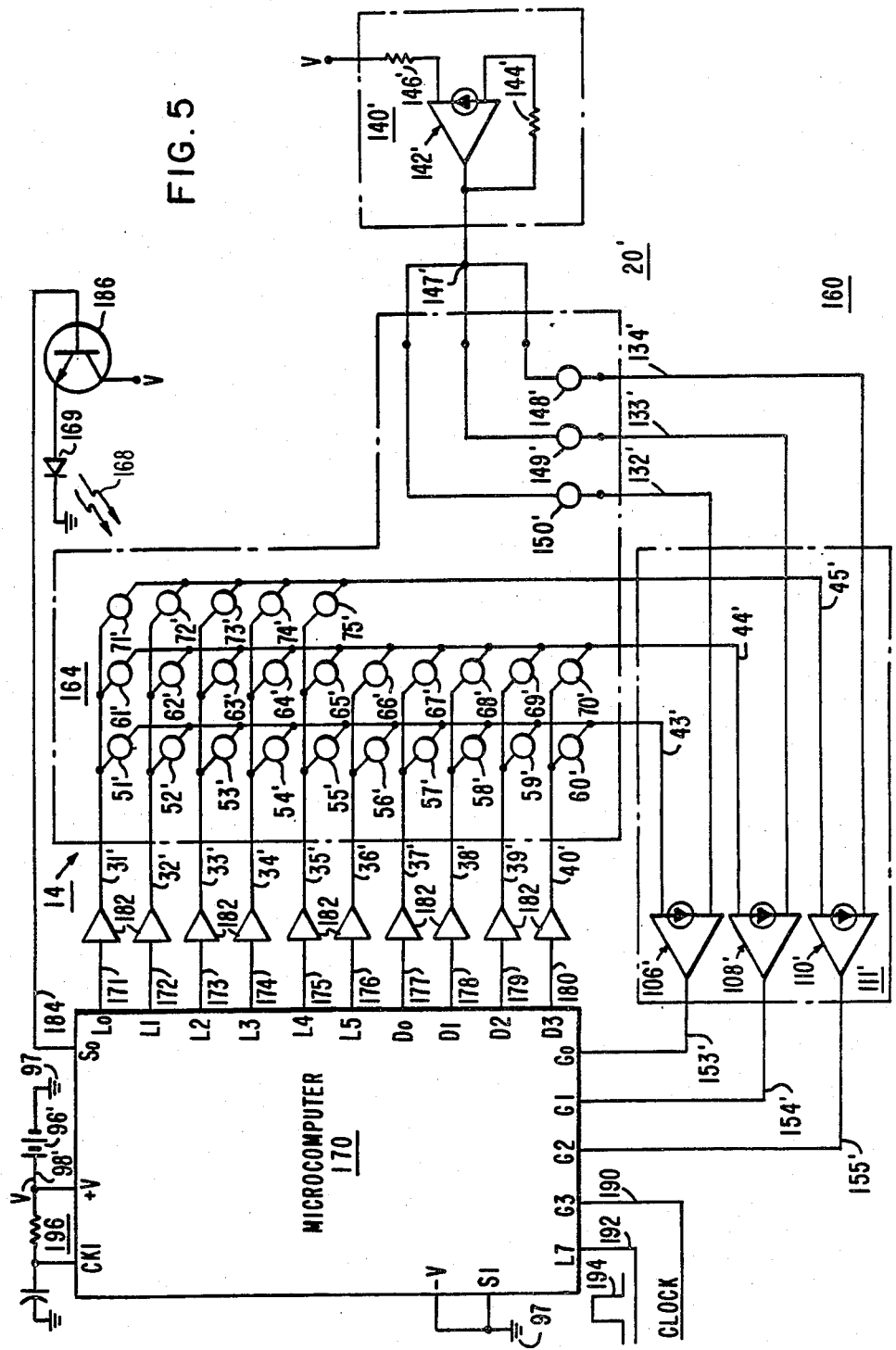
FIG. 5 is a circuit diagram of an optoelectronic meter dial encoder made in accordance with the present invention and including a matrix circuit and a detecting circuit shown in FIG. 1 wherein the matrix includes an array of photoconductive sensors.

Referring now to FIG. 5, an optoelectronic meter dial encoder 160 is shown therein which is an improvement of the optoelectronic meter dial encoder described in the aforementioned U.S. Pat. Nos. 4,037,219 and 4,137,451. The encoder 160 is made for operation in accordance with the present invention as shown in FIG. 1 and the same reference numerals with prime characters are used in FIG. 5 to indicate like and corresponding elements shown in FIG. 1. Accordingly, a matrix 14' is formed as substantially as described hereinabove for the matrix 14 shown in FIG. 1. The same detecting circuit 20 is also provided in the encoder 160. The matrix 14' includes electrically parallel row conductors 31' through 40' corresponding to the row conductors 31 through 40 shown in FIG. 1 and electrically parallel column conductors 43', 44' and 45' corresponding to the column conductors in FIG. 1. A photoconductive array 164 is connected in the matrix 14' and includes the twenty-five photoconductive type resistive sensors, designated by primed reference numerals 51' through 75'. The photoconductive sensors 51' through 75' are of the general type shown in FIG. 3 and more specifically the array 164 is substantially the same as described in the aforementioned U.S. Pat. Nos. 4,037,219 and 4,137,451. The twenty-five photoconductive sensors are connected the same as the sensors 51 through 75 are shown connected in FIG. 1 to the corresponding row and column conductors noted above.

The photoconductive array 164 is optically responsive to a dial shaft encoding illuminations 168 from a light source 169 that are selectably passed to, and shaded from, individual photoconductive sensors of the array 164 by shaft mounted code wheels, not shown, as described in the two aforementioned patents. Thus, the sensors 51' through 75' of the array 164 have substantially the same variable resistance values as described in the U.S. Pat. No. 4,137,451 when subjected to either illuminated or dark conditions. The compensating reference circuit 140' is operative in the same manner as described for the circuit 140 in FIG. 1 and is modified by reference sensor resistors 148', 149' and 151' being provided by photoconductive sensors included in the array 164 and also described in the two aforementioned patents as substantially identical to the other photoconductive sensors of the array 164. The reference photoconductive sensor resistors 148', 149' and 150' are continuously illuminated from the light source 169 to have an illuminated and low resistance value which is substantially the same as the illuminated low and critical resistance values of the encoding photoconductive sensors of the array 164.

A microprocessor based control circuit is included in the encoder 160 and is formed by a microcomputer 170 being of a microcomputer type COP 420 available from National Semiconductor Corp. The microcomputer 170 includes ten output ports which are connected to the conductors designated 171, 172, 173, 174, 175, 176, 177, 178, 179 and 180 in FIG. 5. Individual buffer amplifiers 182 being of a type 74C907 available from the aforementioned National Semiconductor Corporation are connected in series with the microcomputer output conductors 171 through 180 and the matrix inputs to the row conductors 31' through 40', respectively, as shown in FIG. 5. A further conductor 184 is connected from the microcomputer 170 to a transistor switch 186 to control the energization of the aforementioned LED light source 169. Three inputs to the microcomputer 170 are provided on the conductors 153', 154' and 155' providing the detection signal outputs of the current-measuring detectors 106', 108' and 110' as also correspondingly provided by the detectors 106, 108 and 110 shown in FIG. 1. A further input to the microcomputer 170 includes a conductor 190 providing a source of data clock signals. A data input/output port of the microcomputer 170 is connected to a conductor 192 which provides the data input and data output signals to and from the microcomputer 170. The data signals 194 are utilized in a communication system which includes telemetry of information including remote metering which includes binary coded signals corresponding to the coded output signals 30 shown in FIG. 1 for representing the meter dial reading status information produced by the encoder 160. The voltage source 96' is utilized to provide a power supply bus voltage V on the power supply conductor 98' which is also used to supply the microcomputer circuit 170 and also the other circuits in the detecting circuit unit 20', as described in connection with the description of FIG. 1. Also, the buffer amplifiers 182 and the light source 169 controlled by the transistor switch 186 are supplied by the voltage source 96'. The internal clock frequency determining network 196 and the remaining power supply and ground reference potential connections to the microcomputer circuit 170 are shown at the top of FIG. 5.

The encoder 160 is advantageously used in connection with the use of the microcomputer circuit 170 since it has a limited number of output and input ports. Accordingly, the encoding circuit arrangement in the encoder of the aforementioned U.S. Pat. No. 4,137,451, requiring at least twenty-five separate matrix input conductors, cannot be used without undue complexity. The internal control of the microcomputer circuit 170 is in accordance with a stored program sequence of operation wherein the aforementioned sampling control 18 and the readout unit 28 functions are provided within the microcomputer circuit 170. To provide the scanning operations of the encoder 160, the output ports connected with the conductors designated 171 through 180 are sequentially energized by the voltage V. It is a characteristic of the microcomputer circuit 170 to have the output ports either at the power supply voltage V or at the potential of the ground reference 97'. Accordingly, the associated buffer amplifiers 182 have an open source output so that when the output port is activated the power supply voltage V is applied individually to the matrix input conductors 31' through 40'. When the output ports of the microcomputer circuit 170 are inactive the buffer amplifiers 182 provide a very high impedance and essentially an open circuit condition at the matrix inputs to the row conductors 31' through 40'. The output ports of the microprocessor circuit 170 and the buffer amplifiers effectively form an electronic switch arrangement producing either an open high-impedance circuit or a closed low-impedance circuit to energize the matrix inputs in the manner of the switches 99 in FIG. 1.

In operation of the encoder 160 the photoconductive resistive sensors 51' through 75' of the array 164 are sequentially scanned by the connection of the matrix 14' to the voltage source V through the microcomputer circuit output ports effectively in the same manner as described hereinabove wherein the sensors of the matrix 14 are scanned. The matrix outputs at the column conductors 43', 44' and 45' are connected along with the associated reference conductors 132', 133' and 134' to the current-measuring detectors 106', 108' and 110' as described hereinabove to detect the illuminated status and critical low resistance of a sensor and the dark status and high resistance of a sensor in the array 164 when the detecting circuit 20' is operating in the switching and current comparator mode of operation as also described hereinabove. Accordingly, the output conductors 153', 154' and 155' produce the detection signals 22', 24' and 26', respectively shown in FIG. 1, to the input ports of the microcomputer circuit 170 which senses the high and low voltage states of the detection signals for developing signals corresponding to the binary coded output signals 30 for inclusion in the data signals 194 which are transmitted from the microcomputer circuit 170 at the conductor 192.

The compensating reference circuit 140' in the encoder 160 is provided to detect the low and critical resistance value of each of the photoconductive sensors when activated by the illuminating radiations 168. However, the resistance characteristics of each of the photoconductive sensors are not exactly the same, as noted in the aforementioned U.S. Pat. No. 4,137,451. For example, when the photoconductive sensor elements of the array 164 are subjected to illuminated and dark encoding status conditions, the high and low sensing currents from the sensors can differ by being in the order of one-hundred times greater in the illuminated and low resistance state than in the dark and high resistance state. Due to the sensor characteristic variations and variations in the illuminating radiations 168, the sensing current ratios between illuminated and dark resistance values vary and also the currents through the sensors being illuminated can vary by ratios in the order of ten to one. The ratio determining resistors 146' and 144' in the reference circuit 140', corresponding to the resistors 146 and 144 in FIG. 1, are provided with corresponding resistance values R1' and R2', respectively, which produce a reference voltage Vref at the junction 147' to the reference resistors 148', 149' and 150' so that the threshold values of the reference currents 136', 137' and 138' produce switching at the detectors 106', 108' and 110' at the highest sensing current levels produced by the sensor critical resistances. If the ratio n of R1'/R2' is established at ten to one for the resistors in circuit 140', in accordance with the above description of the resistors 146 and 144, then the reference sensors 148', 149' and 150' will provide the threshold reference current value Iref' effective to sense ten to one ratios in the activated sensor resistance states to be detected. Thus, with the ten to one ratio in any sensing current Iin that may be produced by any illumination activated sensor 166, a range of in the critical low sensor resistance state will be unambiguously detected. The further aforementioned compensating advantages of the reference circuit 140 are also provided in the encoder 160 and additionally the photoconductive sensor reference resistors 148', 149' and 150' provide compensation for collective variations in the characteristics of the sensors 160 and for variations in the ambient conditions commonly affected all the sensor characteristics. It is further noted that since a two-or-three-out-of-five code is used in the encoder 160 as described in the aforementioned patents, a majority of the sensors 166 will have a dark encoding condition and high resistance state at any one time. This is an advantage in maintaining more high impedance branch paths between the matrix column conductors 43', 44' and 45'.

Figure 6:
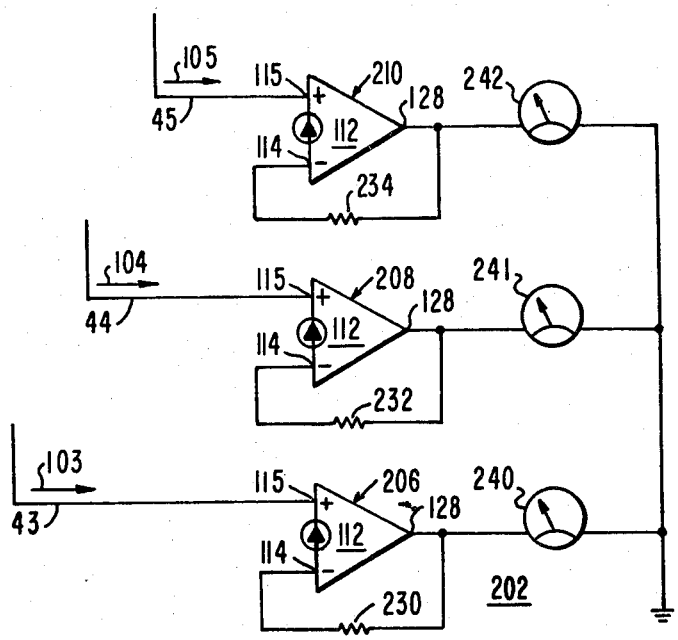
FIG. 6 is a circuit diagram of an alternative detecting circuit having analog current measuring detectors for use in the detecting circuit shown in FIG. 1.
Figure 7:
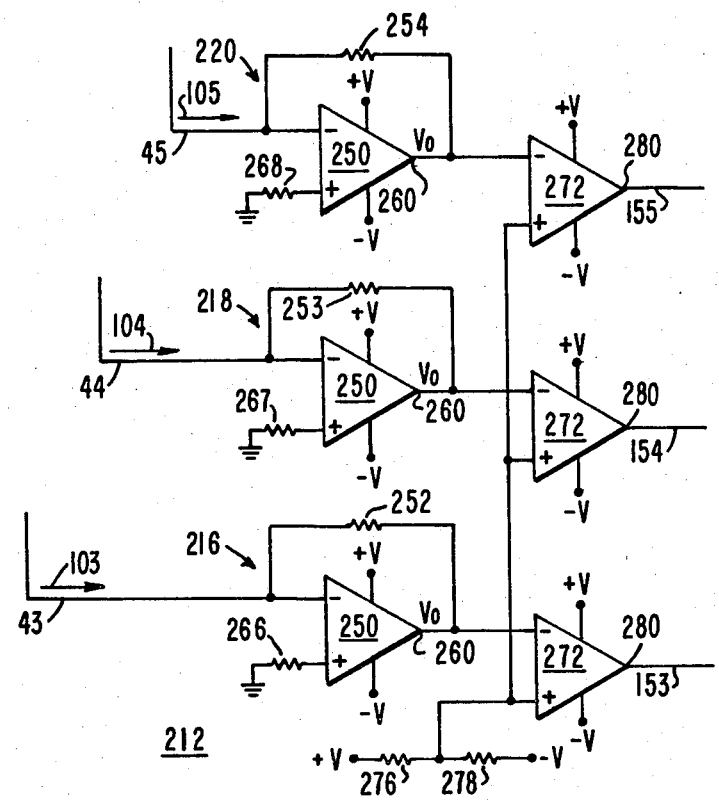
FIG. 7 is a circuit diagram of still another alternative detecting circuit including alternative measuring detectors for replacing the measuring detectors of FIG. 1.

Reference is now made to FIGS. 6 and 7 and it is initially noted that the encoders 10 and 160 described hereinabove include the detecting circuits 20 and 20' having the current-measuring detectors 106, 108 and 110 and 106', 108' and 110' operating in the above-described switching and current comparator mode of operation. An alternative detecting circuit 202 intended to replace the circuit 20 includes current measuring detectors 206, 208 and 210 in FIG. 6 having an analog current measuring mode of operation. Another alternative detecting circuit 212 is shown in FIG. 7 including measuring detectors 216, 218 and 220. It is to be understood that the current measuring detectors 206, 208 and 210 of FIG. 6 and 216, 218 and 220 of FIG. 7 can each be used to replace the three detectors 106, 108 and 110, respectively, in the detecting circuit 120. It is also noted that the current measuring detectors described herein are not limited to the matrices 14 and 14', however, the present invention is most advantageously used in the aforementioned matrices 14 and 14' having a plurality of electrically parallel row conductors and electrically parallel column conductors as described hereinabove. The matrix outputs at the column conductors such as described in the aforementioned matrix 14 include the outputs at the column conductors 43, 44 and 45 shown in FIGS. 6 and 7 which are connected to the aforementioned array 12 of resistive sensors each having variable resistances to be detected. Thus, the matrix supplying the sensing currents to the column conductors 43, 44 and 45 shown in FIGS. 6 and 7 are to conduct variable magnitude sensing current levels which are to be represented by detection signals corresponding to those on the detector output conductors 153, 154 and 155 in FIG. 1 or analog representations thereof as described hereinbelow.

The current-measuring detectors 206, 208 and 210 in FIG. 6 include the aforementioned current-differencing amplifier 112 shown in FIG. 2 having the matrix output currents applied through the column conductors 43, 44 and 45 to the sensing input thereof formed by the second and non-inverting input 115. Feedback resistors 230, 232 and 234 are connected between the output 128 of each amplifier 112 and the first and inverting input 114 as shown in FIG. 6. The current-measuring detectors 206, 208 and 210 provide the important feature of maintaining each of the column-related matrix outputs at conductors 43, 44 and 45 at a substantially fixed and common voltage due to the internal biasing input characteristics of the amplifier 112 as described hereinabove. The output voltage Vo of each of the detectors 206, 208 and 210 will have varying range from essentially zero or ground reference potential to the power supply voltage V less the aforementioned one diode drop. The output voltage Vo variations occur with variable sensing currents applied through the matrix outputs at the conductors 43, 44 and 45, so as to increase with decreased resistance values of a sensor to be detected. An increasing voltage Vo causes increased current flow through the feedback resistors 230, 232 and 234 to maintain the biasing condition of each current-differencing amplifier 112 so that increasing sensing current values applied to the inputs 115 correspondingly produce increases in the output voltage Vo. Suitable analog voltage responsive or indicating devices, represented by the meters 240, 241 and 242 for simplifying the drawings, receive the output voltages Vo. The meters 240, 241 and 242 or other analog measuring and detecting device are calibrated to give linearly related analog signals or dial indications of the variable sensor resistance values to be detected by the detecting circuit 202. The manner of operating the measuring detectors 206, 208 and 210 in FIG. 6 provides current feedback to the inputs 114 from output voltage Vo through the resistors 230, 232 and 234 having resistance values Rfb to balance the sensing currents at the inputs 114. If the value of Rfb is made equal to a predetermined sensor resistance value Rx to be detected, the ratio of Rfb to Rx (Rfb/Rx) will be substantially equal to the ratio of the output voltage Vo relative to the scanning voltage V due to the essentially equal diode voltage drops at the inputs 114 and 115 of each of the amplifiers 112. If the scanning voltage V and output voltage Vo are made large with respect to the input diode voltage drops, then the relationship defined by $Vo/V = Rfb/Rx$ can also be used to accurately detect a large range of sensor resistance values Rx. The output voltage Vo which are produced are equal to K divided by Rx ($Vo = K/Rx$) where K is a constant determined by the known values of V and Rfb. Thus, the detecting circuit 202 maintains the isolated condition of the sensors by keeping the column conductors at equal voltages and detects different sensor resistances which can occur in the matrix 14.

The detecting circuit 212 of FIG. 7 includes measuring detectors 216, 218 and 220 each having a conventional operational amplifier 250. The non-inverting inputs of the operational amplifiers receive the sensing current from the matrix outputs at conductors 43, 44 and 45 when connected to the matrix 14 having the variable resistive sensors as described in connection with the description of FIG. 1. Reference resistors 252, 253 and 254 having values Rref are connected in a feedback circuit between the output 260 and the inverting inputs of the operational amplifiers 250 as shown in FIG. 7. Compensating resistors 266, 267 and 268 are connected between the non-inverting input of the operational amplifiers and the ground reference potential to provide predetermined biasing for establishing the voltage levels at the inverting inputs. The output voltage Vo will force the inverting inputs to a predetermined and preferably the ground reference potential. Accordingly, each of the operational amplifiers 250 are connected in an inverting amplifier mode of operation and the voltages at the matrix outputs at conductors 43, 44 and 45 are maintained at a substantially constant and the ground reference voltage level. The output voltage Vo are responsive to the level of the sensing currents 103, 104 and 105 to vary from the ground reference or zero voltage to a minus voltage as the output voltage is fed back via the resistors 252, 253 and 254 to the inverting inputs to balance the sensing currents occurring thereat. The basic inverting mode of operation of the operational amplifiers 250 and feedback connections places a virtual ground reference at the inverting inputs to maintain the negligible and substantially identical voltages on the matrix outputs at the column conductors 43, 44 and 45 when variable sensing currents occur in the column conductors so as to replace each of the current-measuring detectors 106, 108 and 110 described hereinabove in connection with the description of FIGS. 1 and 5.

Before describing the remaining portions of the measuring detectors 216, 218 and 220 in FIG. 7, it is noted that the operational amplifier output voltage Vo at the detectors provides analog detection signals representative of the resistances of the array sensors corresponding to the analog detection signals provided by the voltage outputs Vo of the measuring detectors 206, 208 and 210 in FIG. 6. The analog output voltages Vo in the detectors 216, 218 and 220 go negative with higher and increasing sensing current inputs rather than positive as in the detectors 206, 208 and 210. Accordingly, the sensor resistance Rx to be detected are determined by the ratio relationships Rx/Rref equal minus V/Vo ($Rx/Rref = -V/Vo$) where V is the aforementioned voltage applied to scan the row conductors.

To provide the same comparator operations in the measuring detectors 216, 218 and 220 as provided by the measuring detectors 106, 208 and 110, three additional output operational amplifiers or comparators 272 are provided. The inverting inputs of the comparators 272 are connected to the outputs 260 of the operational amplifiers 250. The non-inverting input of the operational amplifier comparators 272 are connected to the threshold determining voltage divider resistors 276 and 278 connected across the plus voltage +V and minus voltage −V to produce voltages at the outputs 280 of the operational amplifiers 272 which vary in a binary switching range between a a zero reference potential voltage and plus voltage value V. Accordingly, the same polarity voltage responsive detection signals are provided on the detector output conductors 153, 154 and 155 as are provided at the outputs of the measuring detectors 106, 108 and 110 in FIG. 1. The voltage thresholds set at the non-inverting inputs to each of the operational amplifier comparators 272 provide switching of the amplifiers 272 at a value of Vo at the outputs 260 corresponding to a sensor critical resistance Rx to be detected. It is again noted that the non-inverting inputs to the operational amplifiers 250 maintain the substantially constant zero voltage states at the column conductors 43, 44 and 45 to prevent the intercolumn voltage differences. The latter condition is provided while variable levels of sensing currents 103, 104 and 105 flow in the column conductors and are balanced by the feedback connections including the reference resistors 252, 253 and 254.

While preferred embodiments of the present invention have been described hereinabove it is apparent to those skilled in the art that other modifications and changes of the present invention may be made without departing from the spirit and scope of this invention.

I claim:

1. An encoder for producing electrical output signals in response to a condition to be monitored, comprising:
    an encoding array of resistive sensors having variable resistances responsive to said condition to be monitored;
    a matrix circuit including parallel inputs and parallel outputs connecting each of said resistive sensors to separate intersections of said matrix circuit;
    sampling control means including normally high impedance switching means connected to said inputs of said matrix circuit, said normally high impedance switching means being selectively operable to sequentially energize separate ones of said inputs of said matrix circuit with a predetermined voltage to produce sensing currents in said variable resistances of each of said sensors connected to an energized one of said matrix circuit inputs; and
    a detecting circuit connected with each of said parallel outputs of said matrix circuit, said detecting circuit maintaining minimum voltage differences between said parallel outputs for all values of said sensing currents and producing said electrical output signals in response to said sensing currents.

2. The encoder as claimed in claim 1 wherein the detecting circuit includes a constant voltage circuit means connected to each of the parallel outputs of the matrix circuit, said constant voltage circuit means maintaining said outputs at a ground condition.

3. The encoder as claimed in claim 2 wherein the detecting circuit includes plural current measuring detectors having a sensing input connected with both a separate one of the parallel outputs of the matrix circuit and the constant voltage circuit means, each of said current measuring detectors having an output producing the electrical output signals having different voltage states responsive to the variable resistance states of the sensors.

4. The encoder as claimed in claim 3 including a readout means producing binary coded signals representative of the electrical output signals produced by the plural current measuring detectors.

5. The encoder as claimed in claim 1 wherein the matrix circuit includes plural row conductors and plural column conductors intersecting in insulated relationships, and wherein each of the resistive sensors has two terminals, and further wherein one terminal of each of said sensors is connected to one of said row conductors and one terminal is connected to one of said column conductors.

6. The encoder as claimed in claim 5 wherein the detecting circuit includes at least one current-differencing amplifier.

7. The encoder as claimed in claim 1 wherein the detecting circuit includes plural current measuring detector means separately connected to the outputs of the matrix circuit for receiving the individual sensing currents.

8. The encoder as claimed in claim 7 wherein the detecting circuit includes a reference circuit having plural outputs each producing separate reference currents, and wherein each of the plural current measuring detector means includes a current-differencing amplifier having a first input and a second input, said first input receiving a separate one of the sensing currents and said second input receiving a separate one of said reference currents for operating said current-differencing amplifiers in a current responsive switching comparator mode.

9. The encoder as claimed in claim 8 wherein the reference circuit includes a further current-differencing amplifier producing a predetermined reference voltage at the output thereof, and wherein said reference circuit further includes plural reference resistors each connected between the output of said further current-differencing amplifier and one of the second inputs.

10. The encoder as claimed in claim 9 wherein the array of resistive sensors includes sensors operable between a predetermined low resistance and a high resistance for producing corresponding high and low sensing current levels, respectively, and wherein the reference currents produced by said reference circuit are effective to establish switching thresholds at the current measuring detectors substantially at the transition from below to above said high sensing current level.

11. The encoder as claimed in claim 1 wherein the detecting circuit includes an amplifier circuit means operative in an analog mode and having an inverting input and a non-inverting input, one of said inverting input and non-inverting input being connected by a feedback resistor to the output of said amplifier circuit means such that said output produces the electrical output signals in an analog fashion in response to the variations in the levels of the sensing currents while the column conductors are maintained at substantially negligible voltage differences therebetween when the matrix inputs are receiving the predetermined voltage.

12. The encoder as claimed in claim 11 wherein the amplifier circuit means includes a current-differencing amplifier having the noninverting input thereof receiving sensing currents and having the inverting input thereof connected by feedback resistor to the output of said current-differencing amplifier.

13. The encoder as claimed in claim 11 wherein the amplifier circuit means includes an operational amplifier having the inverting input thereof being connected by the feedback resistor to the output of said operational amplifier and further having the inverting input receiving sensing currents so that a balancing voltage is produced at the column conductor connected thereto.

14. The encoder as claimed in claim 11 wherein the detecting circuit includes analog detecting means responsive to the variations of the electrical output signals.

15. An encoder comprising:
plural resistive sensors including a common array having at least one predetermined resistance to be detected;
matrix means including plural inputs and plural outputs interconnected to said plural resistive sensors such that each sensor is connected between a different pair of the inputs and outputs;
high impedance means terminating each of said plural input conductors of said matrix means;
sampling control means for sequentially applying a predetermined voltage to each of said plural inputs of said matrix means effective to produce sensing currents flowing through the ones of said sensors being commonly connected to an input being energized with each sensing current flowing to said plural outputs, said sensing currents having a predetermined magnitude when flowing from a sensor having said predetermined resistance;
constant voltage means terminating each of said plural outputs of said matrix means for maintaining minimum voltage differences between said plural outputs for all values of said sensing currents;
current measuring detector means responsive to said sensing currents separately occurring in said plural outputs for producing a detection signal indicating when said sensing currents have said predetermined magnitude.

16. The encoder as claimed in claim 15 wherein the current measuring detector means is operable in a current comparator mode so that the output of said current detector means produces either of two voltage states in detection signals, and wherein one of the voltage states is produced in response to the predetermined magnitude of said sensing currents.

17. The encoder as claimed in claim 16 wherein the current detector means includes plural current-differencing amplifiers having inputs connected to said outputs of said matrix means and having predetermined current threshold values so that each produces a separate one of the detection signals being switched between the two voltage states upon a received sensing current varying between the predetermined magnitude and another magnitude wherein said predetermined and said another magnitudes are greater and lesser than said current threshold.

18. The encoder as claimed in claim 17 wherein the plural resistive sensors have predetermined variable low resistances and further, the plural current differencing amplifiers each have a current threshold for detecting the sensing current magnitude produced by the highest of the predetermined variable low resistances when being energized by the predetermined voltage.

19. The encoder as claimed in claim 17 wherein the current measuring detector means includes input means and wherein said encoder further includes reference circuit means producing a predetermined reference current input to said input means to establish the predetermined current threshold at said current measuring detector means.

20. The encoder as claimed in claim 15 wherein the number of the plural outputs of the matrix means is less than the number of the plural inputs of said matrix means.

21. An optoelectronic encoder for a radiation responsive sensor array comprising:
plural photoconductive sensors forming said array, each of said plural sensors having a predetermined low resistance and having a predetermined high resistance relative to said predetermined low resistance, both being produced by predetermined levels of encoding illumination;
a matrix circuit means interconnecting said plural sensors and including plural parallel row conductors and plural parallel column conductors having each of the sensors uniquely connected between one of the row conductors and one of the column conductors;
sampling control means including a plurality of outputs operative between normally high impedance conditions and sequentially controlled low impedance conditions, said outputs of said sampling control means being separately connected to each of said plural row conductors, said sampling control means further including an input connectable to a single predetermined voltage source so as to selectively energize each of said plural row conductors when said outputs thereof are in said sequentially controlled low impedance conditions;
a detecting circuit including means terminating each of said plural column conductors of said matrix circuit means substantially at a common reference ground potential at all times, said detecting circuit further including plural current measuring detectors having common predetermined switching thresholds and further having sensing inputs separately connected to said plural column conductors of said matrix circuit means, said current measuring detectors producing detection signals having either of two signal values in response to sensing currents in said plural column conductors having either of two magnitudes when produced through different ones of said plural sensors correspondingly having either said predetermined low resistance or said high resistance.

22. The optoelectronic encoder as claimed in claim 21 wherein the plural current measuring detectors each include a current-differencing amplifier each having a first input forming the sensing inputs thereof and a second input establishing the common predetermined switching thresholds thereof.

23. The optoelectronic encoder as claimed in claim 22 wherein the detecting circuit includes a compensating reference circuit for producing plural reference currents each being applied to the second inputs of said current-differencing amplifiers.

24. The optoelectronic encoder as claimed in claim 23 wherein the compensating reference circuit includes a further current-differencing amplifier operative in an active voltage divider mode and wherein said reference circuit further includes plural reference resistors for applying the reference currents from said further current-differencing amplifier to each of the second inputs of said plural current-differencing amplifiers.

25. The optoelectronic encoder as claimed in claim 24 wherein the plural current-differencing amplifiers and the further current-differencing amplifier have commonly matched characteristics and wherein the plural reference resistors are formed by photoconductive sensors substantially identical to the photoconductive sensors forming the encoding array for providing predetermined reference resistance values when continuously illuminated at the predetermined level of encoding illumination.

26. The optoelectronic encoder as claimed in claim 25 wherein the further current-differencing amplifier of the compensating reference circuit includes a first input including a feedback resistor connecting said first input to the output of said further current-differencing amplifier and wherein a second input of said further current-differencing amplifier includes a series input resistor so that the ratio of the resistance values of said input resistor and said feedback resistor establish a predetermined reference voltage at the output of said further current-differencing amplifier effective to produce a predetermined reference current value for establishing the predetermined common switching thresholds.

27. The optoelectronic encoder as claimed in claim 26 wherein the single predetermined voltage source commonly supplies the supply voltages of the further current-differencing amplifier, and further commonly supplies the sampling control means.

28. The optoelectronic encoder as claimed in claim 21 wherein the sampling control means has the outputs thereof selectively operable between ground potential and the voltage of the predetermined voltage source to effect the sequential controlled conditions, and wherein said sampling control means includes a plurality of buffer amplifiers forming said plurality of outputs thereof for maintaining said normally high impedance condition and sequentially providing said low impedance conditions at said plurality of outputs.

29. The encoder as claimed in claim 6 wherein the at least one current-differencing amplifier includes a sensing input connected to one of the column conductors and a reference input, and wherein the detecting circuit includes reference resistor means connected to receive a predetermined reference voltage effective to produce a predetermined value in the output detection signal for indicating a predetermined one of the resistance states of the resistive sensors producing the sensing currents to the sensing input thereof.

30. The encoder as claimed in claim 29 wherein the detecting circuit includes a further current-differencing amplifier having matched characteristics with the at least one current differencing amplifier and producing the predetermined reference voltage at the output thereof.

31. The encoder as claimed in claim 30 wherein the further current-differencing amplifier has one input connected to the predetermined voltage sequentially received at the input to each of the row conductors for producing said predetermined reference voltage at a predetermined fractional ratio to the predetermined voltage received at said one input.

* * * * *